March 12, 1957 R. L. BRIGHT ET AL 2,785,236

TRANSISTOR AMPLIFIER FOR ALTERNATING CURRENTS

Filed Nov. 4, 1955

WITNESSES

Edwin E. Bassler

John B. Davidson

INVENTORS
Richard L. Bright &
Richard O. Decker
BY
Paul E. Friedemann
ATTORNEY

United States Patent Office 2,785,236

Patented Mar. 12, 1957

2,785,236

TRANSISTOR AMPLIFIER FOR ALTERNATING CURRENTS

Richard L. Bright, Adamsburg, and Richard O. Decker, Wilkinsburg, Pa., assignors to Westinghouse Electric Corporation, East Pittsburgh, Pa., a corporation of Pennsylvania Application November 4, 1955, Serial No. 544,866

4 Claims. (Cl. 179—171)

This invention relates to alternating-current amplifying devices, and more particularly to such devices for amplifying rectangular-wave voltages wherein use is made of transformers the magnetic cores of which have a substantially rectangular hysteresis characteristic.

Figure 1:
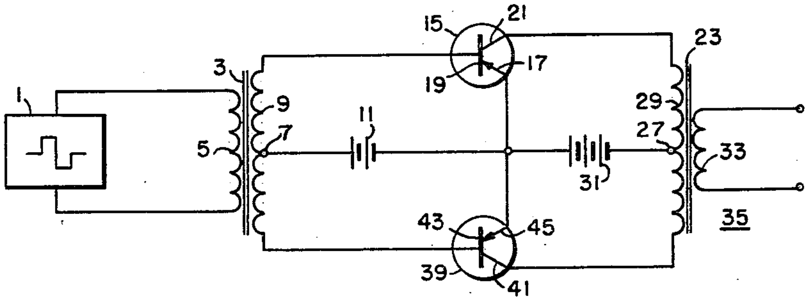

When it is desired to increase the power level of a train of pulses having a substantially rectangular-waveshape, it has been common practice to use a push-pull amplifier having a transformer coupled input and a transformer coupled output. A pair of switching devices, such as transistor switches, are interposed between the transformers. Such an arrangement is illustrated in Figure 1 and will be described in greater detail below.

It is advantageous in connection with such devices to use a material having a rectangular-loop hysteresis characteristic as the magnetic material in the output transformer. The reasons for this are that the hysteresis losses in the magnetic material are generally greatly reduced by the use of a rectangular-loop material, and that it is possible to produce sharper output pulses since the rectangular-loop material exhibits very little magnetic energy storage.

A primary reason that such amplifiers have not found wide use is that the average value of the input pulses must be maintained exactly at zero and the characteristics of the transistors must be very carefully matched. Otherwise, in due course of time the output transformer will be driven to saturation in one sense or the other, the impedance thereof will fall to an extremely low value, and the transistors will be destroyed by virtue of the resulting extremely large current flow.

An additional reason is that there is a strong probability that the transistors would be irreparably damaged should the magnitude of the driving voltage decrease so as to bring about operation in the Class-A region. The resulting heat dissipation that would be required of the transistor would almost inevitably be far beyond its maximum capabilities.

Accordingly, it is an object of this invention to provide an alternating current amplifying device having an output transformer utilizing a magnetic core material having a rectangular-loop hysteresis characteristic wherein the devices that control current conduction in the primary winding of the output transformer are protected against excessive current flow in the event the core material should be driven to saturation.

Another object is to provide a Class-C amplifier utilizing junction transistors wherein the transistors are protected against excessive power dissipation that would result from operation thereof in their Class-A region.

Still another object is to provide a transistor amplifier having improved operational characteristics.

Yet another object is to provide an amplifier for rectangular wave pulses wherein the rectangular waveshape will be maintained with maximum fidelity.

In accordance with one aspect of our invention, we provide an additional winding on the output transformer for each transistor, which winding is connected in series with the section of the input transformer secondary winding which supplies bias voltage to the base electrode of the transistor switch. The polarity of the voltage across the additional winding is such as to aid in the bias voltage so that a positive feedback loop is provided. Thus, as soon as the transistor starts conducting so as to induce a voltage in the additional winding, the transistor will be immediately driven to saturation due to the cumulative effect of the feedback. Operation of the transistor in the Class-A region is rendered almost impossible. Further, should the magnetic material in the output transformer be driven into its saturation region, the voltage across the additional winding will be reduced substantially to zero, limiting the current through the transistor. To increase the sharpness of the transition from non-conduction to conduction and vice versa, a Zener diode is placed in series with the base potential source. When the input voltage reaches a magnitude whereat reverse current breakdown occurs, the sudden, relatively large surge of base current resulting therefrom immediately drives the transistor to a region of high collector current conduction even discounting the effect of the positive feedback loop. The induced voltage in the output transformer secondary winding will have an extremely steep wavefront. By virtue of the unique cooperation effected between the Zener diodes and the feedback windings, it is possible to achieve an output voltage waveform that approximates a square wave even more exactly than does the input voltage waveform.

Figure 2:
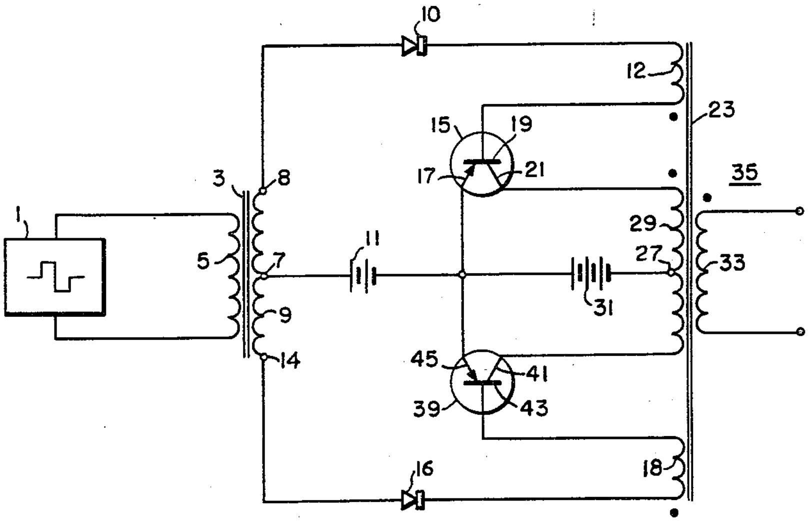
PRIOR ART Fig.2.

Other objects and features of our invention will become more apparent upon consideration of the following description thereof when taken in connection with the accompanying drawings, wherein:

Figure 1 is a schematic diagram illustrating an alternating-current amplifying device to be found in the prior art; and Figure 2 is a schematic diagram of an embodiment of our invention.

As shown in Fig. 1, the signal voltage source denoted by reference numeral 1 may be any rectangular-wave generating device such as is well known to the prior art. Alternatively, a non-rectangular wave device may be substituted when it is desired to generate a rectangular waveform voltage from a signal voltage having a non-rectangular waveform such, for example, as a sinusoidal waveform. The voltage source 1 is coupled to the primary winding 5 of a transformer 3, which transformer has a centertapped secondary 9. The outer terminals of secondary winding 9 are, respectively, connected to the base electrodes 19 and 43 of p-n-p junction transistors 15 and 39. The centertap 7 of winding 9 is directly connected to the positive terminal of bias source 11, the negative terminal of which is directly connected to the emitter electrodes 17 and 45 of transistors 15 and 39, respectively. The collector electrodes 21 and 41 of the transistors 15 and 39 are connected to the outer terminals of the primary winding 29 of output transformer 35. The centertap 27 of winding 29 is directly connected to the negative terminal of bias source 31, the positive terminal of which is connected to the emitter electrodes 17 and 45 of transistors 15 and 39, respectively. Transformer 35 has a secondary winding 33, the terminals of which are the output terminals of the amplifier.

As has been mentioned, it is desirable from the standpoint of maximum efficiency that the core 23 of transformer 35 be made of a rectangular-loop hysteresis material such as is sold under the trade names of Orthonal or Deltamax. However, should the characteristics of the transistors 15 and 39 be unbalanced or should the waveform of input signal source 1 be unbalanced so that greater collector current is derived from transistor 15 than from transistor 39 (or vice versa), core 23 will in course of time be driven to saturation in one sense or the other, depending on the sense of unbalance in the characteristics of the transistors or in the input voltage waveform. Should this happen, the impedance to current flow offered by the input winding 29 will be suddenly reduced to a very small fraction of its unsaturated value resulting in an increase in collector current, of such magnitude as to destroy one or the other, or both, of the transistors.

With reference now to the embodiment of our invention depicted in Fig. 2, signal voltage source 1 is again shown coupled to the primary winding 5 of signal voltage transformer 3. The centertap 7 of secondary winding 9 again is connected to the positive terminal of emitter-base bias source 11, the negative terminal of which bias source 11 is connected to the emitters 17 and 45 of transistors 15 and 39, respectively. The collectors 21 and 41 of transistors 15 and 39 are again connected to the outer terminals of primary winding 29 of transformer 35. The centertap 27 of primary winding 29 is likewise connected to the negative terminal of emitter-collector bias source 31 of the transistors 15 and 39. The positive terminal of source 31 is connected to the emitters 17 and 45.

The outer terminal 8 of winding 9 is connected to the anode of semiconductor diode 10, the cathode of which is connected to base electrode 19 of transistor 15 through a feedback winding 12 wound on core 23. Similarly, the other outer terminal 14 of winding 9 is connected to the anode of semiconductor diode 16, the cathode of which is connected to base 43 of transistor 39 through feedback winding 18 wound on core 23. The semiconductor diodes 10 and 16 are chosen so as to have a reverse current breakdown voltage, or Zener breakdown voltage, of smaller magnitude than the maximum voltage from the centertap 7 to the outer terminals 8 and 14 of secondary winding 9 so that the so-called "Zener breakdown" will occur at a predetermined point during the rise time of the input voltage.

The feedback windings 12 and 18 are wound so as to inject a positive feedback voltage in the base circuitry of the transistors. For example, assuming that Zener diode 10 has broken down so as to render transistor 15 conducting, the current through the top half of winding 29 will be increasing and the resulting change in magnetic flux in core 23 will induce a voltage in winding 12 that will render base 19 more negative with respect to emitter 17 and further increase the current in the collector circuit of transistor 15. Similarly, with increasing current flowing through the emitter-collector current conduction path of transistor 39 and through the bottom half of winding 29, there will be induced a voltage in winding 49 that will make the base electrode of transistor 39 more negative with respect to the emitter thereof.

Note that in the drawings, the polarity marks on the transformer windings are in accordance with the convention of the American Standards Association, wherein instantaneous direction of current into one polarity mark will induce a voltage in another winding corresponding to current out of the polarity mark thereon.

The operation of the above-described embodiment of our invention is as follows: Assume that the input voltage waveform is such that terminal 8 is slightly negative with respect to the centertap 7 of secondary winding 9, that terminal 14 is slightly positive with respect to the centertap 7, and that the voltage difference therebetween is increasing. Since base electrode 43 is being rendered positive with respect to emitter electrode 45, transistor 39 is being driven increasingly into its cut-off region and no current will flow in the collector circuit thereof. However, as soon as the Zener voltage of diode 10 is reached, the diode 10 will break down and there will be an almost instantaneous rush of emitter-base current through transistor 15 which will render the transistor immediately conducting at a high value of collector current. The induced voltage in winding 12 will make base 19 increasingly negative with respect to emitter 17, thus regeneratively increasing the emitter current at an extremely high rate until collector current saturation is reached. On the next half cycle of signal source 1, current flow from emitter 17 to base 19 will be interrupted as soon as the voltage between terminal 8 and the centertap 7 is of greater magnitude and of opposite polarity to the voltage across winding 12. As soon as the Zener voltage of diode 16 is reached, that diode will break down and the sequence of events described above with respect to transistor 15, winding 12 and diode 10 will ensue with respect to diode 16, winding 18 and transistor 39.

In the event of unbalance in the input voltage waveform such as to bring about saturation of magnetic core 23, the voltage induced across the winding 12 or 18 through which current is flowing at that particular instant will immediately drop to a very low value and the current flowing through the transistor will be determined by the voltage across half of the secondary winding 9 less the voltage drop across the Zener diode through which current is flowing. With prudent circuit design, this current will be only a small fraction of the normal base current thereby limiting the collector current to a safe value.

As a result of the cumulative effect of the Zener diodes 10 and 16 and the feedback windings 12 and 18, the output voltage appearing across secondary winding 33 of transformer 35 will be a rectangular-wave having an almost vertical wavefront. The sudden rush of base current of an extremely high value after reverse current breakdown insures that the transition through the lower knee of the collector current vs. base current characteristic of the transistor shall be of extremely short duration and the resulting deviation in the output voltage waveform from a true square wave shall be minimized.

As has been previously noted, by virtue of the unique cooperation between the Zener diode and the feedback windings, the output voltage waveform ordinarily approximates a square wave than does the input voltage waveform when reasonably careful circuit design practices are followed.

The invention is not to be restricted to the specific structural details, arrangement of parts or circuit connections herein set forth, as various modifications thereof may be effected without departing from the spirit and scope of this invention, and it is desired that only such limitations shall be imposed as are indicated in the appended claims.

We claim as our invention:

1. Alternating-current amplification network comprising: an input transformer having a centertapped secondary; first and second transistor means each having an emitter, base and collector electrodes; an output transformer having a centertapped primary winding, an output winding, and first and second feedback windings; a bias source connecting the emitter electrode of each of said transistor means to the centertap of said primary winding; a bias source connecting said emitter electrodes of said transistor means to the centertap of said centertapped secondary winding; a first Zener diode serially connecting said first feedback winding and one end terminal of said centertapped secondary windings to the base electrode of said first transistor means; a second Zener diode serially connecting said second feedback winding and the other end terminal of said centertapped secondary winding to the base electrode of said second transistor means; said diodes having a Zener breakdown voltage less than the maximum voltage between centertap and end terminals of said input transformer secondary winding, each of said diodes being poled so as to oppose base current flow of the transistor associated therewith, the induced voltage across said feedback windings acting to aid the input voltage producing current flow through the transistor associated therewith.

2. In an alternating-current amplification network including first and second junction transistor means, each having at least emitter, base and collector electrodes;

an input transformer having a centertapped secondary and an output transformer having a centertapped primary and a core of magnetic material having a rectangular loop hysteresis characteristic; a potential source common to said first and second transistor means connected between emitters and collectors thereof through the respective halves of said centertapped primary winding to form a push-pull output circuit; a serially connected feedback winding on said output transformer and a Zener diode corresponding to each half of said centertapped secondary winding serially connected with the half of said centertapped secondary winding corresponding thereto; each of said Zener diodes being poled so as to oppose emitter-base current conduction until the Zener breakdown voltage thereof is exceeded; each of said feedback windings being connected so as to provide positive feedback between output and input circuits of said transistor means.

3. In an alternating current amplification network including first and second junction transistor means, each having at least emitter, base and collector electrodes; an input transformer having a centertapped secondary and an output transformer having a centertapped primary and a core of magnetic material having a rectangular loop hysteresis characteristic; a potential source common to said first and second transistor means connected between emitter and collector thereof through the respective halves of said centertapped primary winding to form a push-pull output circuit; a serially connected feedback winding on said output transformer and a Zener diode corresponding to each half of said centertapped secondary winding serially connected with the half of said centertapped secondary winding corresponding thereto; each of said Zener diodes being poled so as to oppose emitter-base current conduction until the Zener breakdown voltage thereof is exceeded; each of said feedback windings being connected so as to provide positive feedback between output and input circuits of said transistor means; the voltage induced across each of said feedback windings being smaller in maximum magnitude than the voltage across the half of said centertapped secondary winding corresponding thereto.

4. Alternating-current amplification network comprising: first and second transistor means each including emitter, base, and collector electrodes; an output circuit including a transformer having a secondary winding and a balanced primary winding, one half of said primary winding being connected in the collector circuit of said first transistor means and the other half of which is connected in the collector circuit of said second transistor means in a push-pull arrangement; a push-pull input circuit connected between emitter and base of said first and second transistor means, said emitters being connected together, said input circuit including terminals for a balanced input signal source, and serially connected first Zener diode means and first feedback winding means connecting half of said signal source to the emitter-collector circuit of said first transistor means and second Zener diode means and feedback winding means connecting said other half of said signal source to the emitter-collector circuit of said second transistor means; said first and second feedback winding means being inductively associated with said balanced primary winding to inject a positive feedback voltage in the respective emitter-base circuits associated therewith; said Zener diodes having a reverse-current breakdown voltage of less magnitude than the maximum magnitude of the input voltage coupled thereacross and being poled to oppose flow of base current therethrough until the magnitude of input voltage thereacross is equal to the reverse-current breakdown voltage thereof.

No references cited.